(12) United States Patent
Pradeepkumar et al.

(10) Patent No.: US 10,405,466 B1
(45) Date of Patent: Sep. 3, 2019

(54) POWER-MODULE ASSEMBLY WITH ENDCAP

(71) Applicant: Ford Global Technologies, LLC, Dearborn, MI (US)

(72) Inventors: Akash Changarankumarath Pradeepkumar, Westland, MI (US); Alfredo R. Munoz, Ann Arbor, MI (US); Michael W. Degner, Novi, MI (US); Edward Chan-Jiun Jih, Troy, MI (US); Guangyin Lei, Canton, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 0 days.

(21) Appl. No.: 16/008,311

(22) Filed: Jun. 14, 2018

(51) Int. Cl.
| | |
|---|---|
| *H05K 7/20* | (2006.01) |
| *H01L 23/473* | (2006.01) |
| *H02M 7/00* | (2006.01) |
| *B60K 6/405* | (2007.10) |
| *B60L 15/00* | (2006.01) |
| *B60L 50/50* | (2019.01) |

(52) U.S. Cl.
CPC ......... *H05K 7/20927* (2013.01); *B60K 6/405* (2013.01); *B60L 15/007* (2013.01); *B60L 50/50* (2019.02); *H01L 23/473* (2013.01); *H02M 7/003* (2013.01); *H05K 7/20218* (2013.01)

(58) Field of Classification Search
CPC ............... H01L 2924/00; H01L 23/473; H01L 2924/1305; H01L 2924/13055; H01L 2924/181; H01L 25/0753; H01L 2924/13091; H01L 25/072; H01L 25/115; H01L 25/117; H01L 23/4012; H05K 7/20927; H05K 7/1432; H05K 7/2089; H05K 7/20218; H02M 7/003; H02M 2001/007; B60L 11/18; B60L 15/007
USPC ............... 361/699, 707, 702, 704, 716, 676, 361/679.46, 679.53, 728, 729, 831
See application file for complete search history.

(56) References Cited

U.S. PATENT DOCUMENTS

| | | |
|---|---|---|
| 3,692,551 A | 9/1972 | Weaver |
| 6,765,285 B2 | 7/2004 | Shinohara et al. |
| 6,865,080 B2 | 3/2005 | Radosevich et al. |
| 7,965,510 B2 | 6/2011 | Suzuki et al. |
| 8,125,781 B2 | 2/2012 | Mamitsu et al. |
| 8,391,008 B2 | 3/2013 | Dede |
| 8,462,531 B2 | 6/2013 | Nishikimi et al. |
| 9,210,829 B2 | 12/2015 | Hotta et al. |
| 9,723,764 B2 | 8/2017 | Sugita |
| 2006/0096299 A1* | 5/2006 | Mamitsu ............... H01L 23/473 62/3.2 |
| 2007/0119574 A1* | 5/2007 | Olesen ..................... F28F 3/12 165/100 |
| 2012/0119347 A1 | 5/2012 | Mamitsu et al. |

(Continued)

*Primary Examiner* — Mandeep S Buttar
(74) *Attorney, Agent, or Firm* — David Kelley; Brooks Kushman, P.C.

(57) ABSTRACT

According to one embodiment, a power-module assembly includes a power-module stack having coolant chambers interleaved with power modules and supply and return manifold channels extending axially along the stack. An endcap has a major side defining recessed inlet and outlet manifold cavities aligned with the channels and inlet and outlet ports disposed on one or more minor sides that are perpendicular to the major side.

20 Claims, 7 Drawing Sheets

(56) References Cited

U.S. PATENT DOCUMENTS

| | | | |
|---|---|---|---|
| 2013/0220587 A1* | 8/2013 | Tamura | F28F 3/02 |
| | | | 165/185 |
| 2013/0335918 A1* | 12/2013 | Tachibana | H05K 5/0213 |
| | | | 361/689 |
| 2014/0096938 A1 | 4/2014 | Kojima et al. | |
| 2016/0309622 A1 | 10/2016 | Lei et al. | |
| 2016/0322281 A1 | 11/2016 | Shintani et al. | |
| 2017/0036563 A1* | 2/2017 | Degner | B60L 15/04 |

* cited by examiner

POWER-MODULE ASSEMBLY WITH ENDCAP

TECHNICAL FIELD

The present disclosure relates to power-module assemblies for an electric powertrain of a vehicle.

BACKGROUND

Vehicles such as battery-electric vehicles (BEVs), plug-in hybrid electric vehicles (PHEVs) and fully hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert direct current coming from the battery into alternating current compatible with the electric machines. The power inverter may also act as a rectifier to convert alternating current from the electric machines to direct current compatible with the battery.

SUMMARY

According to one embodiment, a power-module assembly includes a power-module stack having coolant chambers interleaved with power modules, and supply and return manifold channels extending axially along the stack. An endcap has a major side defining recessed inlet and outlet manifold cavities aligned with the channels and inlet and outlet ports disposed on one or more minor sides that are perpendicular to the major side.

According to another embodiment, a power-module assembly includes power modules each having a frame with a first opening and a second opening, and a power stage seated within the first opening. The power modules are arranged in a stack with the second openings aligned to define manifold channels extending axially along the stack and with the power stages spaced apart to define coolant chambers interleaved with the power stages and in fluid communication with the manifold channels. An endcap of the assembly includes inner and outer major sides, minor sides extending between the major sides, manifold cavities recessed into the inner major side, and inlet and outlet ports in fluid communication with the manifold cavities. At least one of ports is disposed on one of the minor sides. The endcap is attached to the stack with the inner major side disposed against an end one of the frames and with the manifold cavities aligned with the manifold channels.

According to yet another embodiment, a method of modular assembly includes assembling same first and second power-module assemblies that each include a stack of power stages and a manifold. The method further includes attaching a first endcap, having manifold cavities and inlet and outlet ports, to the first power-module assembly, and attaching a second endcap, having manifold cavities and inlet and outlet ports, to the second power-module assembly, wherein the inlet and outlet ports have different placements on the first and second endcaps.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
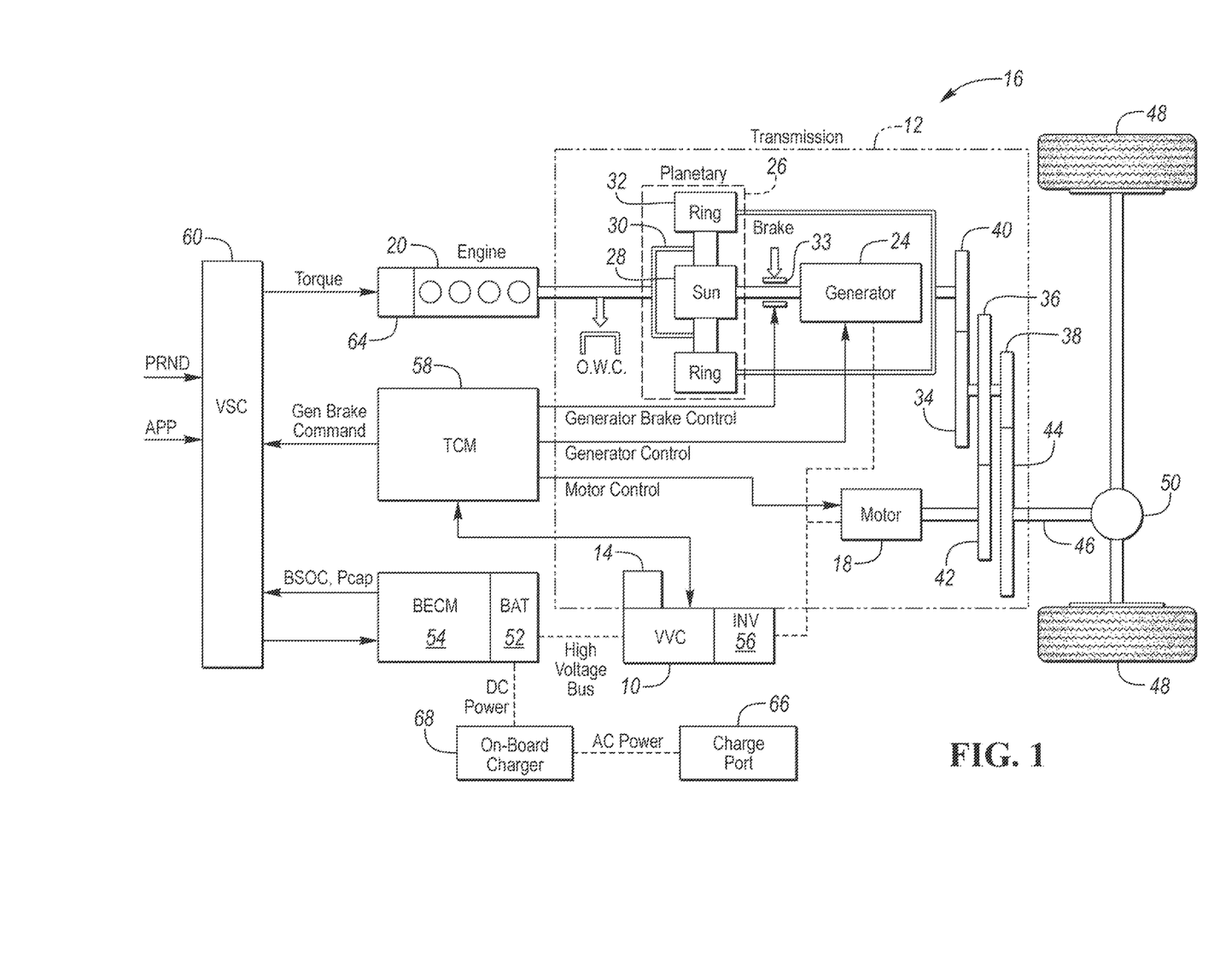
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with assistance from an internal combustion engine 20. The electric machine 18 may be an alternating current (AC) electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 may include a planetary gear unit 26, which includes a sun gear 28, a planet carrier 30, and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 may further include a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48.

The vehicle 16 includes an energy storage device, such as a traction battery 52 for storing electrical energy. The battery 52 is a high-voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52. A high-voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable-voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the main battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one invertor associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV, a BEV, or a fuel-cell electric vehicle.

Figure 2:
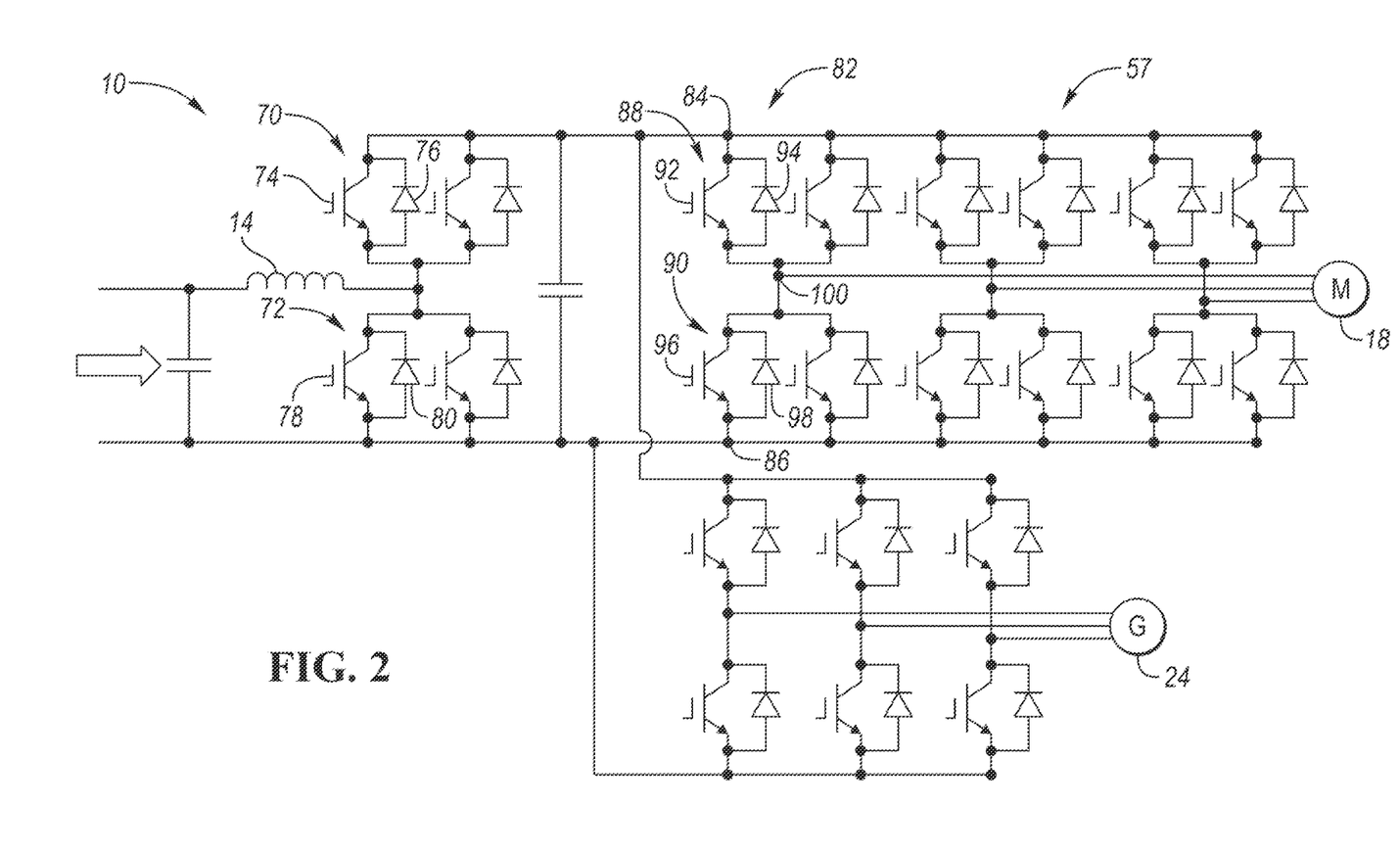
FIG. 2 is a schematic diagram of a variable-voltage converter and a power inverter.

Referring to FIG. 2, an electrical schematic of the VVC 10 and the inverter 56 is shown. The VVC 10 may include a one or more power stages having a transistor-based switching arrangement, such as a half bridge. Each power stage includes a first switching unit 70 and a second switching unit 72 for boosting the input voltage ($V_{bat}$) to provide output voltage ($V_{dc}$). The first switching unit 70 may include a first transistor 74 connected in parallel to a first diode 76, but with their polarities switched (anti-parallel). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations.

The inverter 56 may include a plurality of power stages having a transistor-based switching arrangement, such as a half-bridge that are stacked in an assembly. Each of the half bridges may include a positive DC lead 84 that is coupled to a positive DC node from the battery and a negative DC lead 86 that is coupled to a negative DC node from the battery. Each of the half bridges 82 may also include a first switching unit 88 and a second switching unit 90. The first switching unit 88 may include a first transistor 92 connected in anti-parallel to a first diode 94. The second switching unit 90 may include a second transistor 96 connected in anti-parallel to a second diode 98. The first and second transistors 92, 96 may be IGBTs or FETs. The first and second switching units 88, 90 of the each of the half-bridges 82 convert the DC power of the battery into a single phase AC output at the AC lead 100. Each of the AC leads 100 are electrically connected to the motor 18 or generator 24.

In the illustrated embodiment, the VVC 10 includes two power stages and the inverter includes 9 power stages (three for the generator 24 and six for the motor 18). In other embodiments, the VVC 10 includes one power stage and the inverter includes six power stages (three for the generator 24 and three for the motor 18). The VVC power stages and the inverter power stages may be identical components and generally referred to as power stages 82. Both the VVC power stages and the inverter power stages may be arranged in a common stack.

FIGS. 3 to 9 and the related discussion describe example power-module assemblies and their individual components. The power-module assemblies may be for a power inverter, such as power inverter 56 described above, or may be for another type of power electronics.

Figure 3:
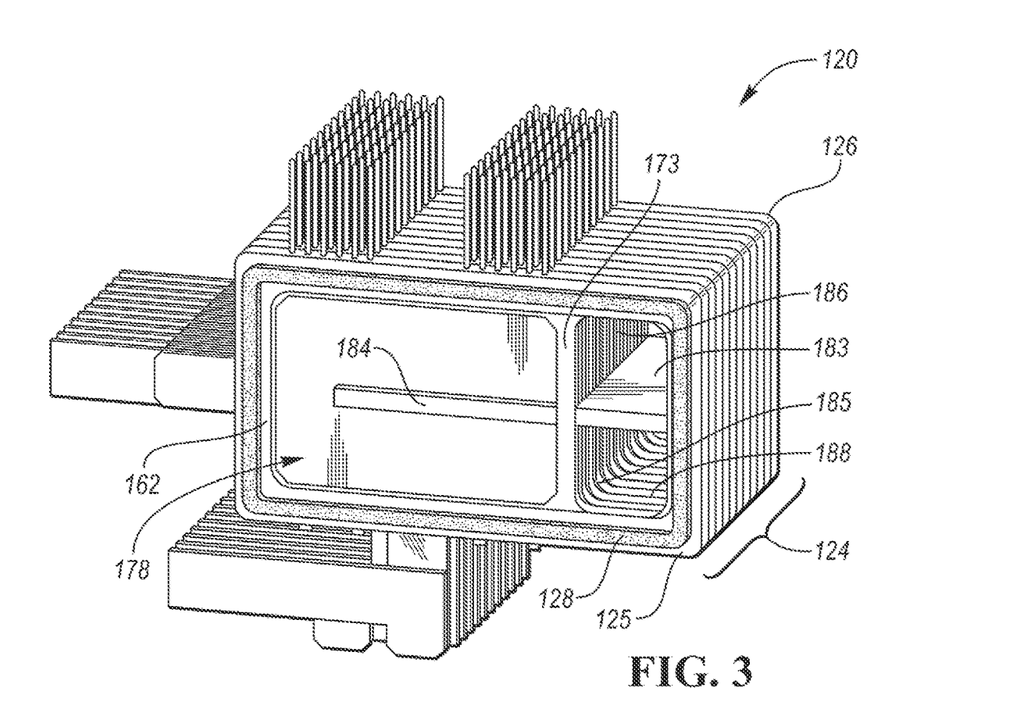
FIG. 3 is a perspective view of a power-module assembly with the endcap and the endplate omitted for illustrative purposes.
Figure 4:
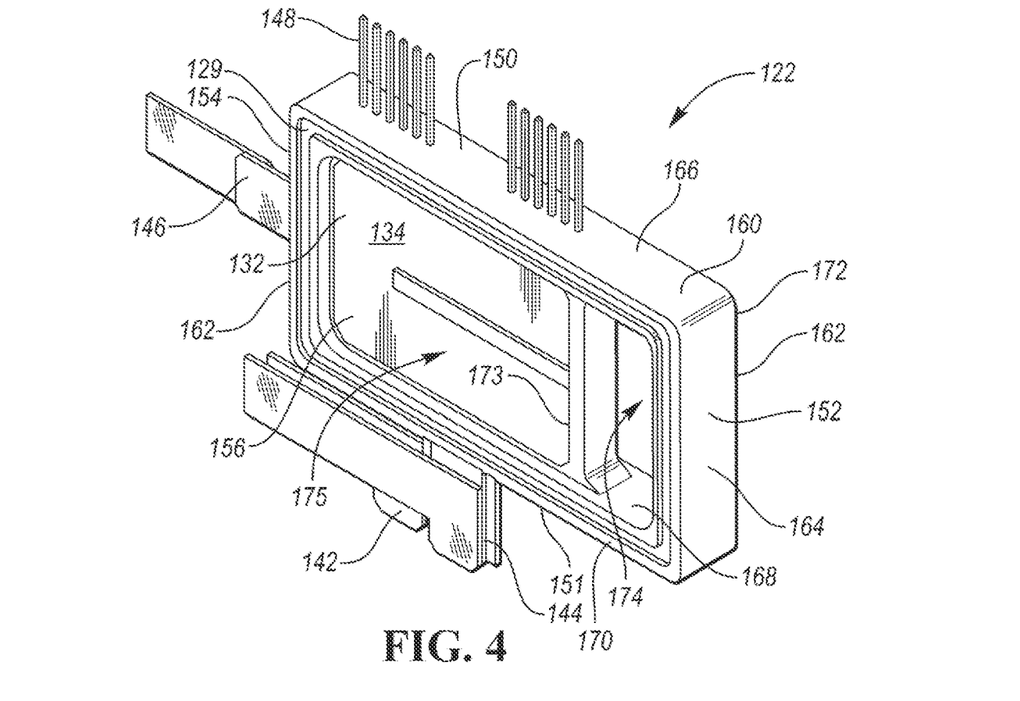
FIG. 4 is a perspective view of a power module of the power-module assembly.

Referring to FIGS. 3 and 4, an example power-module assembly 120 includes a plurality of power modules 122 arranged in a stack 124. Each power module 122 includes opposing major sides 162 and minor sides 164 extending therebetween. The power modules 122 are stacked such that the major sides 162 of adjacent power modules are disposed against each other. The power-module stack 124 includes a first power module 125 defining one end of the stack and a last power module 126 defining the other end of the stack. The power modules 122 may be secured together by adhesive, bracketry, fasteners, or the like. A seal, such as gasket 128, may be disposed between adjacent power modules to prevent leaking. The power modules 122 may include recessed seats 129 for the gaskets 128. The power modules 122 may all be the same, or the power-modules assembly 120 may include two or more sets of power modules that are at least slightly different. All of the power modules 122 are the same in the example power-module assembly 120.

Each of the power modules 122 includes a power stage 132 that contains the semiconductor devices. Each power stage 132 may include a half bridge. The power stages 132 are encased by a frame 160. In the illustrated embodiment, the frame 160 has a generally rectangular body including a left side 154, a right side 152, a top 150, and a bottom 151 cooperating to define an exterior 166, an interior 168, a front surface 170, and a back surface 172. The frame 160 may have a different shape in other embodiments. It is to be understood that directional terms, such as left and right, are used for ease of description and do not limit the power modules, or any other component, as being in any particular orientation.

Each of the power stages 132 may include opposing major sides 134 and edges (not visible). The edges may be embedded in the interior surface 168 as shown. The power stage 132 may include a positive DC power terminal 142, a negative DC power terminal 144, an AC power terminal 146, and signal pins 148 that are electrically connected with the semiconductor devices of the power stage 132. The location of the terminals and signal pins may vary by embodiment and are not limited to the configuration shown. In the illustrated example, the signal pins 148 extend from the top 150, terminals 142 and 144 extend from the bottom 151, and the terminal 146 extends from the left side 154. Each of the power stages 132 may include a first plate 156 that defines the outer surface of one of the major sides 134 and a second plate (not visible) that defines the other of the major sides 134. The plates may be metallic, plastic, composite, or a combination thereof. The semiconductor devices of the power stage 132 may be filled with an epoxy or other material to electrically isolate the semiconductor devices from the plates and other components.

Each of the frames 160 may include an internal wall 173 that cooperates with the outer walls of the frame to define a power-stage opening 175 in which the power stage 132 is housed and a manifold opening 174 adjacent to the power-stage opening 174. The opening 174 may be defined by the cooperation of the interior 168 of the top 150, the right side 152 and the bottom 151, and the internal wall 173. Alternatively, the internal wall 173 may be omitted, in which case, the right side of the power stage 132 defines the left side of the opening 174.

The frame 160 is thick enough to extend past the outer plates 156 of the power stage 132 in the longitudinal direction of the stack 124. The extended region of the frame 160 and the plates 156 define a pair of pockets 178 recessed into the major sides 162 of the power module 122.

Figure 5:
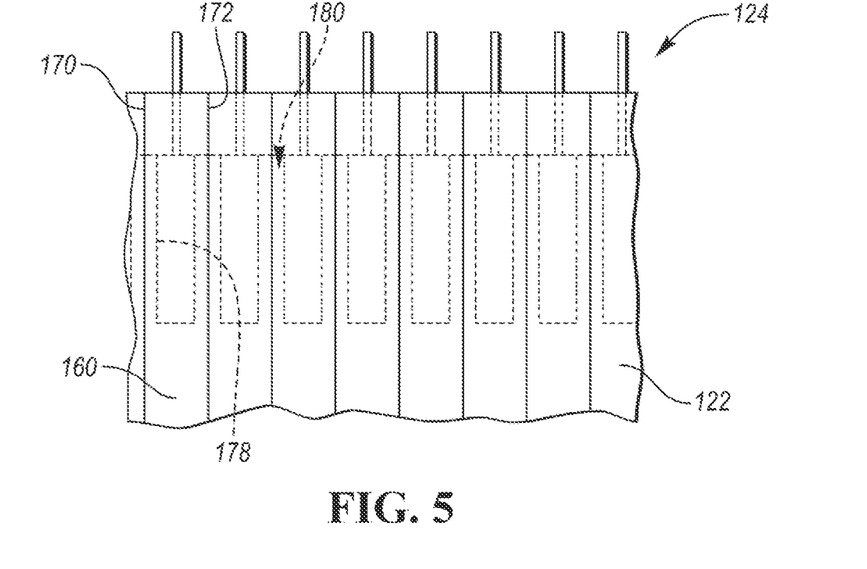
FIG. 5 is a partial side view of the power-module assembly.

As is best shown in FIGS. 3 and 5, the individual power modules 122 are arranged in the stack 124 with the front and back surfaces 170, 172 of adjacent frames 160 being disposed against each other. When stacked, the pockets 178 of adjacent power modules 122 cooperate to define coolant chambers 180 interleaved with the modules 122. Each of the coolant chambers 180 may be bounded on all sides by features of the frame 160, or may only be bounded on five sides and may have an open bottom side. Each of the coolant chambers 180 may include a partitioning wall 184 (not shown in FIG. 5) that extends from the internal wall 173 to partially divide the coolant chamber 180 creating a U-shaped flow path. The partitioning wall 184 may be integrally formed with the frame 160 or may be an insert. The partitioning wall 184 and the internal wall 173 may not be included in all embodiments. The coolant chambers 180 may include fins (not shown) or other features disposed therein to guide fluid circulating within the chambers 180.

The openings 174 of each power module 122 are aligned and cooperate to define a manifold 185 extending along a length of the stack 124. In the illustrated embodiment, a divider 183 forms a pair of manifold channels, supply channel 186 and return channel 188, within the manifold. The supply and return channels 186, 188 may extend along the length of the stack 124 and are in fluid communication with the coolant chambers 180. Openings (not shown) may be formed in the walls 173 to fluidly connect the manifold channels 186, 188 and the chambers 180.

The coolant chambers 180 may be connected to the manifold 185 in parallel. Parallel cooling provides a more uniform temperature gradient along the length of the stack because the coolant within the supply channel 186 is relatively uniform. Coolant chambers arranged in series may have a relatively large temperature gradient, where coolant at the exit end of the stack is much hotter than at the entrance end of the stack. In some embodiments, series cooling may be advantageous. As such, series cooling is not outside the scope of this disclosure.

Figure 6:
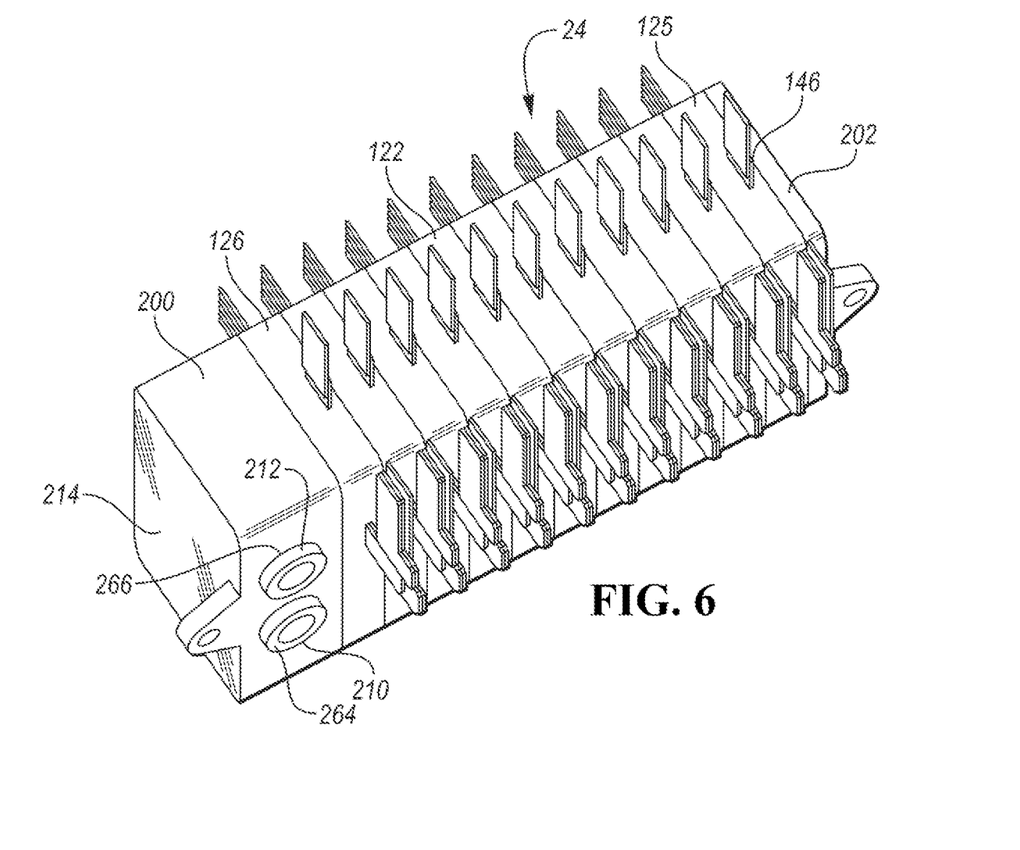
FIG. 6 is a perspective view of the power-module assembly.
Figure 7:
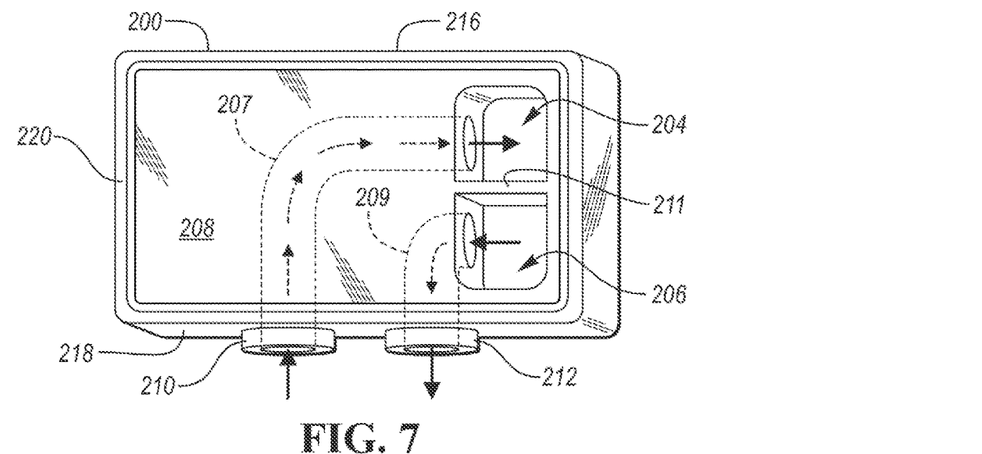
FIG. 7 is an endcap according to one embodiment.

Referring to FIGS. 6 and 7, the stack 124 may be sealed on one end by an endcap 200 that is connected to the last power module 126 and on the second end by an endplate 202 that is connected to the first power module 125. The endcap 200 cooperates with the pocket 178 of the last module 126 to define one of the coolant chambers 180. The endplate 202 cooperates with the pocket 178 of the first module 125 to define another of the coolant chambers 180. These outer chambers may have a smaller volume than the interior coolant chambers. Alternatively, the endcap 200 and the endplate 202 may define a recessed area to provide the outer coolant chambers with a volume similar to that of the interior chambers.

The endcap 200 includes plumbing for connecting the manifold 185 to external coolant lines, whereas the endplate 202 does not include plumbing and simply serves to seal the end of the stack 124. As such, the thickness of the endcap 200 may be thicker than the endplate 202. In the illustrated embodiment, the endcap 200 is approximately four times thicker than the endplate, however, the thickness differential may very across different embodiments.

The endcap 200 may define an inlet manifold cavity 204 and an outlet manifold cavity 206. The cavities may be recessed into an inner face (inner major side) 208 of the endcap 200 and are separated by a dividing wall 211. The endcap 200 is configured so that the inlet manifold cavity 204 is aligned with the supply channel 186 and the outlet manifold cavity 206 is aligned with the return channel 188. The inlet manifold cavity 204 is in fluid communication with an inlet port 210, and the outlet manifold cavity 206 is in fluid communication with an outlet port 212. The endcap 200 defines internal passages 207, 209 that connect between the inlet and outlet ports 210, 212 and the inlet and outlet manifold cavities 204, 206, respectively.

The endcap 200 may include an outer face 214 (outer major side) and a plurality of minor sides extending between the outer face 214 and the inner face 208. The minor sides may include a top 216, a bottom 218, a left 220, and a right 222. The inlet and outlet ports 210 and 212 may be disposed on the outer face 214 or any of the minor sides. In some embodiments, the inlet and outlet ports are located on a same side, however, in other embodiments, the inlet and outlet ports are located on different sides.

In the illustrated example of FIG. 7, the inlet and outlet ports 210 and 212 are arranged adjacent to each other on the bottom 218. In other embodiments, for example, the inlet port 210 is disposed on the bottom 218 and the outlet port is disposed on the right 222 (see FIG. 8), or the inlet port 210 is disposed on the bottom 218 and the outlet port 212 is disposed on the top 216 (see FIG. 9). These illustrated embodiments are not to be construed as limiting and other alternative placements for the inlet and outlet ports 110, 112 are contemplated.

Figure 10:
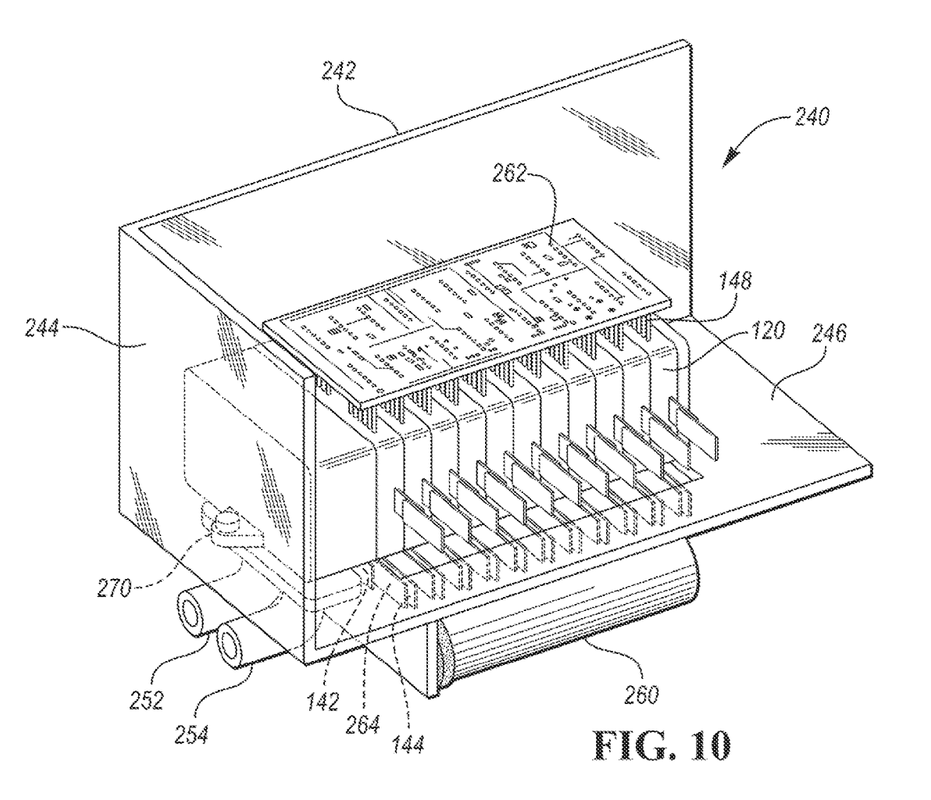
FIG. 10 is a perspective view of a power inverter with some walls of the case omitted for clarity.
Figure 11:
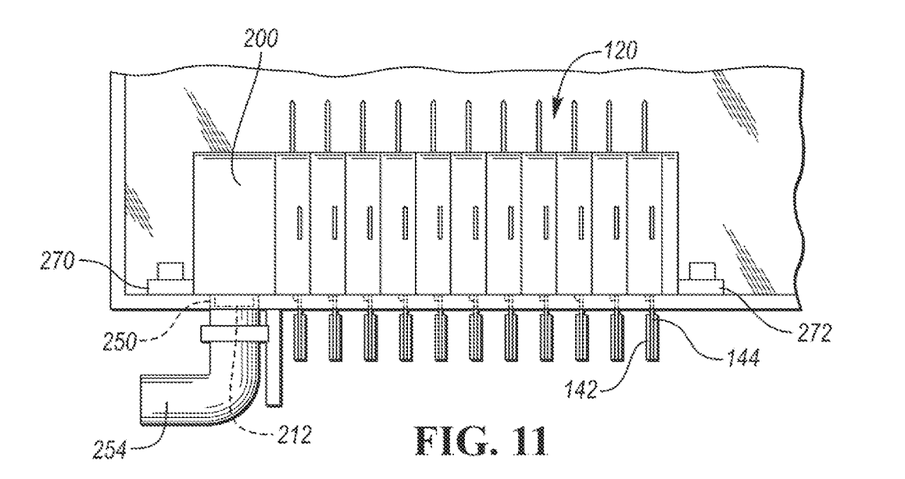
FIG. 11 is a side view of the power inverter.

Referring to FIGS. 10 and 11, the power-module assembly 120 is one of several components that make up a vehicle power inverter 240. The power inverter 240 may include a case 242 (partially shown) having a plurality of walls 244. The power inverter 240 is mounted to one of the walls such as the bottom wall 246. Which is generally parallel to the axial direction of the stack. In order to connect the power-module assembly 120 with the cooling system and the high-voltage bus, components of the power-module assembly 120 extend through the case 242. For example, the positive and negative DC terminals 142, 144 may extend through an opening/openings (not shown) defined in the bottom wall 246. The terminals 142, 144 connect with a capacitor bank 260 of the power inverter 240 that is mounted outside of the case 242. In some embodiments, the power inverter and the capacitor bank are disposed in the same case. Busbars 264 may be used to electrically connect the capacitor bank 260 to the power-module assembly 120. The power inverter 240 may also include a gate drive board 262 that is disposed within the case 242 and a connected with the signal pins 148.

The cooling system, which is external to the case 242, also must connect with the power-module assembly 120. The connection may be facilitated by forming an inlet hole (not visible) and an outlet hole 250 in the bottom wall 246 to allow the supply line 252 to be connected with the inlet port 210 and the return line 254 to be connected to the outlet port 212, respectively. The lines 252, 254 may extend through the holes to connect with the ports 210, 212, or the ports may extend through the holes. The ports 210, 212 may include shoulders 265, 266 (see FIG. 6) that extend into the holes. If the shoulders 265, 266 are provided, they can be used as locating features for aligning the power-module assembly 120 on the case 242.

The endcap 200 and the endplate 202 may have mounting tabs 270, 272 that are attached to the case 242. For example, the tabs 270, 272 may be fastened to the bottom wall 246.

Different vehicle models may have different packaging constraints and power requirements for the power inverter 240. The power inverter 240 is modular for both packaging configurations and power requirements. The power-module assembly 120 can be modified by adding or subtracting power modules 122 from the stack 124 based on specific power requirements of the vehicle.

The use of an endcap also increases the versatility of the power-module assembly 120 by allowing the power-module assembly 120 to be place in various position within the case or in a different shaped case. As described above, the inlet and outlet ports of the endcap may be placed into a wall that supports the coolant lines. This eliminates the need for additional plumbing within the case 242. Thus, the endcap 200 may be used when it is advantageous for both the supply line 252 and the return line 254 to be mounted on the bottom wall 246 of the case 242. If other applications require the supply line and the return line to be placed on different walls of the case 242, then a different endcap may be used in conjunction with a same power-module stack to place the inlet and outlet ports at a desired location. For example, the endcap shown in FIG. 8 may be used when it is advantageous for one of the ports to be on a bottom wall the case in the other of the ports to be on a sidewall of the case. This allows the manufacturer to produce a plurality of identical power-module stacks that are fitted with different endcaps according to which vehicle they are being installed on.

While the above described power-module assemblies 122 only include a single endcap 200, the endplate 202 may be replaced with a second endcap 200 in other embodiments. Here, each of the endcaps may only include a single port. For example, the first endplate may include an inlet port and the second endplate may include an outlet port. In some embodiments, multiple ports may be formed on both of the first and second endcaps if the internal plumbing of the power module requires additional ports.

Figure 8:
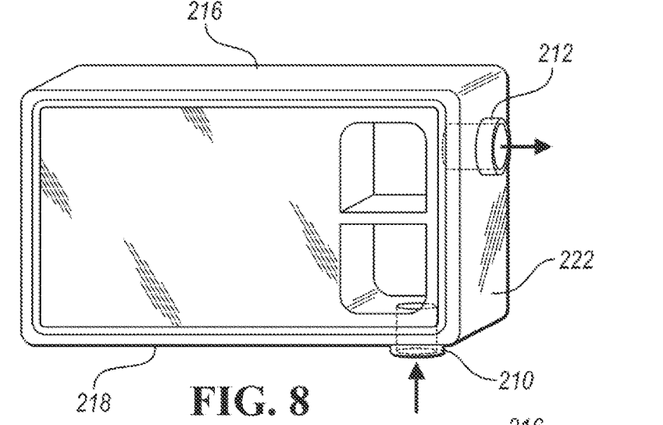
FIG. 8 is an endcap according to another embodiment.
Figure 9:
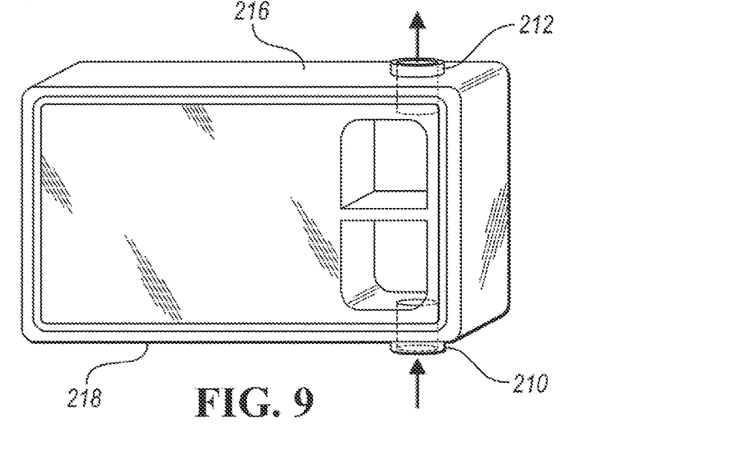
FIG. 9 is an endcap according to yet another embodiment.
Figure 12:
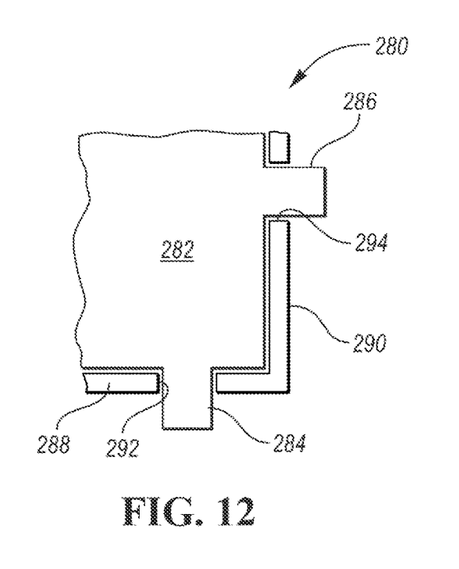
FIG. 12 is a diagrammatical front view of another power inverter.

Referring to FIG. 12, another power inverter 280 includes a power-module assembly having an endcap 282, which is the same as the endcap shown in FIG. 8. The endcap 282 includes a coolant inlet port 284 and a coolant outlet port 286. The power inverter 280 includes a case having a first wall 288 and a second wall 290. The first wall defines a hole 292, and the second wall 290 defines a hole 294. The inlet port 284 is received in the hole 292, and the outlet port 286 is received in the hole 294. This allows the coolant line to be located on different walls of the case.

Figure 13:
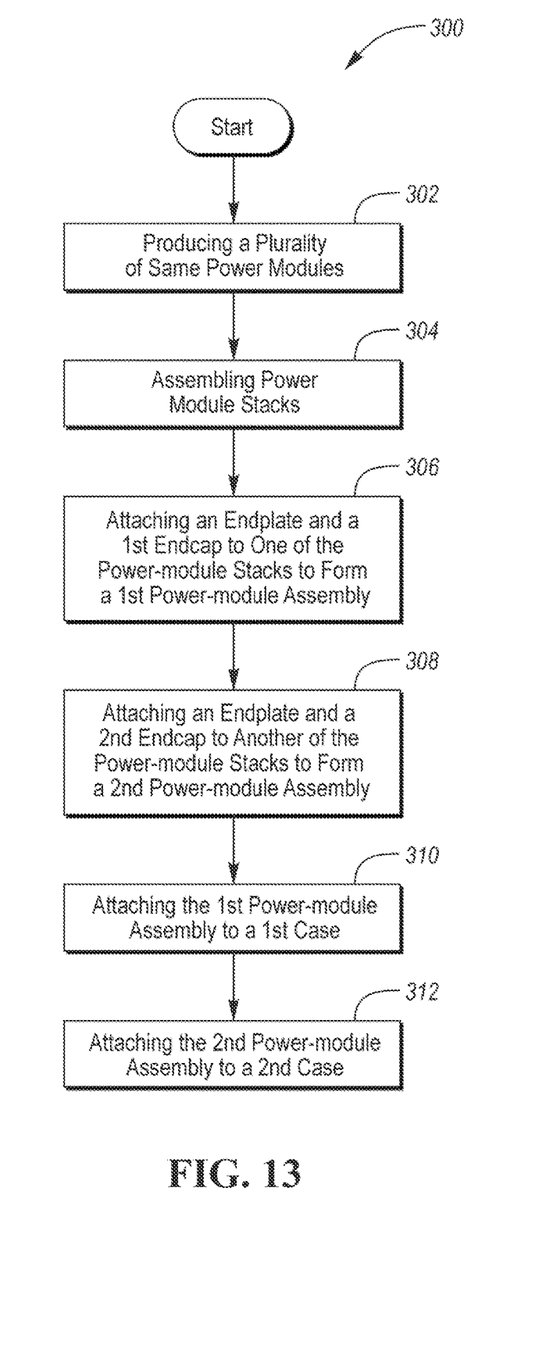
FIG. 13 illustrates a method of making a power-module assembly.

FIG. 13 illustrates a method 300 for manufacturing modular power inverters for multiple applications. The method 300 only discloses some of the steps involved with producing power inverters and additional undiscussed steps may be performed. In addition, not all of the disclosed steps need be performed in all embodiments of this disclosure.

At step 302, a plurality of same power modules are produced. For example, a plurality of power modules 122 may be produced at step 302. In some embodiments, a plurality of different sets of power modules may be produced. The different sets of power modules may have different terminal and signal pin locations, may be different sizes or shapes, may have different power stages, etc.

At step 304, individual power modules are assembled into stacks, such as stack 124. The power modules may be secured as a stack using adhesive, fasteners, clips, a jig, or other retention means. A single set of stacks may be produced at step 304, or alternatively, multiple different sets of stacks may be produced if multiple sets of power modules were produced at step 302.

At step 306, an endplate is attached to one end of the stack and a first endcap, e.g., endcap 200, is attached to the other end of the stack to form a first power-module assembly. This process may be repeated to form additional first power-module assemblies.

At step 308, an endplate is attached to one end of another stack and a second endcap e.g., endcap of FIG. 8, is attached to the other end of that stack to form a second power-module assembly that is different than the first power-module assembly. The second power-module assembly may include the same type of stack as the first power-module assembly but has a different endcap to give the second power-module assembly different inlet port and/or outlet port locations. This process may be repeated to form additional second power-module assemblies.

At step 310, the first power-module assembly is attached to a first case having holes configured to align with the ports of the first endcap. At step 312, the second power-module assembly is attached to a second case having holes configured to align with the ports of the second endcap.

By repeating the above described process using different combinations of power modules and endcaps a plurality of different power-module assemblies can be produced from a limited number of stock components. This may facilitate manufacturing efficiencies and reduce costs.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A method of modular assembly comprising:
    assembling same first and second power-module assemblies that each include a stack of power stages and a manifold;
    attaching a first endcap, having manifold cavities and inlet and outlet ports, to the first power-module assembly; and
    attaching a second endcap, having manifold cavities and inlet and outlet ports, to the second power-module assembly, wherein the inlet and outlet ports have different placements on the first and second endcaps.

2. The method of claim 1, wherein the inlet and outlet ports of the first endcap are disposed on a same side of the first endcap, and the inlet and outlet ports of the second endcap are disposed on different sides of the second endcap.

3. The method of claim 1 further comprising attaching the first power-module assembly to a wall of a case such that one of the inlet and outlet ports is aligned with a hole defined in the case.

4. The method of claim 1, wherein the power stages of the first and second power-module assemblies have a transistor-based switching unit.

5. A method of modular assembly comprising:
    assembling same first and second power-module assemblies that each include a plurality of power modules arranged in a stack, each power module including a frame having a first opening with a power stage seated therein and a second opening, wherein, for each of the first and second power-module assemblies, the power modules are arranged in the stack such that the second openings are aligned to define a manifold extending axially along the stack;
    attaching a first endcap, having manifold cavities and inlet and outlet ports, to the first power-module assembly; and
    attaching a second endcap, having manifold cavities and inlet and outlet ports, to the second power-module assembly, wherein the inlet and outlet ports have different placements on the first and second endcaps.

6. The method of claim 5, wherein the inlet and outlet ports of the first endcap are disposed on a same side of the first endcap, and the inlet and outlet ports of the second endcap are disposed on different sides of the second endcap.

7. The method of claim 5 further comprising attaching the first power-module assembly to a wall of a case such that one of the inlet and outlet ports is aligned with a hole defined in the case.

8. The method of claim 5, wherein the power stages of the first and second power-module assemblies have a transistor-based switching unit.

9. The method of claim 5, wherein the manifold cavities of the first endcap include inlet and outlet manifold cavities in fluid communication with the inlet and outlet ports of the first endcap, respectively.

10. The method of claim 9, wherein the manifold of the first power-module assembly includes an inlet channel and an outlet channel, and wherein the first endcap is attached to the first power-module assembly such that the inlet channel and the inlet manifold cavity are aligned and the outlet channel and the outlet manifold cavity are aligned.

11. The method of claim 10, wherein the manifold of the second power-module assembly includes an inlet channel and an outlet channel, and the manifold cavities of the second endcap include inlet and outlet manifold cavities in fluid communication with the inlet and outlet ports of the second endcap, respectively, and wherein the second endcap is attached to the second power-module assembly such that the inlet channel and the inlet manifold cavity are aligned and the outlet channel and the outlet manifold cavity are aligned.

12. The method of claim 5, wherein the first endcap is attached to the first power-module assembly such that the manifold cavities are in aligned with the manifold.

13. The method of claim 5, wherein the manifold cavities of the second endcap include inlet and outlet manifold cavities in fluid communication with the inlet and outlet ports of the second endcap, respectively.

14. The method of claim 13, wherein the manifold cavities of the first endcap include inlet and outlet manifold cavities in fluid communication with the inlet and outlet ports of the first endcap, respectively.

15. A method of modular assembly comprising:
assembling same first and second power-module assemblies that each include a plurality of power modules arranged in a stack, each power module including a frame having a first opening with a power stage disposed therein and a second opening, wherein, for each of the first and second power-module assemblies, the power modules are arranged in the stack such that the second openings are aligned to define manifold channels extending axially along the stack and such that the power stages are spaced apart to define coolant chambers interleaved with the power stages and in fluid communication with the manifold channels;
attaching a first endcap, having manifold cavities and inlet and outlet ports, to the first power-module assembly; and
attaching a second endcap, having manifold cavities and inlet and outlet ports, to the second power-module assembly, wherein the inlet and outlet ports have different placements on the first and second endcaps.

16. The method of claim 15, wherein the first endcap further has inner and outer major sides and minor sides extending between the major sides, wherein the manifold cavities are recessed into the inner major side.

17. The method of claim 16, wherein the second endcap further has inner and outer major sides and minor sides extending between the major sides, wherein the manifold cavities are recessed into the inner major side.

18. The method of claim 15, wherein the first endcap is attached to the first power-module assembly such that the manifold cavities are in aligned with the manifold channels.

19. The method of claim 18, wherein the second endcap is attached to the second power-module assembly such that the manifold cavities are in aligned with the manifold channels.

20. The method of claim 15, wherein the inlet and outlet ports of the first endcap are disposed on a same side of the first endcap, and the inlet and outlet ports of the second endcap are disposed on different sides of the second endcap.

* * * * *